United States Patent [19]

Yamazaki et al.

[11] Patent Number: 5,349,366
[45] Date of Patent: Sep. 20, 1994

[54] ELECTRO-OPTICAL DEVICE AND PROCESS FOR FABRICATING THE SAME AND METHOD OF DRIVING THE SAME

[75] Inventors: Shunpei Yamazaki, Tokyo; Yasuhiko Takemura, Kanagawa, both of Japan

[73] Assignee: Semiconductor Energy Laboratory Co., Ltd., Kanagawa, Japan

[21] Appl. No.: 966,831

[22] Filed: Oct. 27, 1992

[30] Foreign Application Priority Data

Oct. 29, 1991 [JP] Japan .................................. 3-309915

[51] Int. Cl.⁵ .............................................. G09G 3/34
[52] U.S. Cl. ...................................... 345/92; 345/206; 359/59
[58] Field of Search ................ 340/784, 718, 719; 359/54, 55, 56, 57, 58, 59; 358/241, 236; 345/205, 87, 92, 90, 98, 100, 206

[56] References Cited

U.S. PATENT DOCUMENTS

| | | | |
|---|---|---|---|
| 4,021,798 | 5/1977 | Kojima et al. | 340/324 M |
| 4,042,854 | 8/1977 | Luo et al. | 340/719 |
| 4,537,471 | 8/1985 | Grinberg et al. | 359/59 |
| 4,870,396 | 9/1989 | Shields | 340/784 CL |
| 5,095,248 | 3/1992 | Sato | 340/781 |
| 5,095,304 | 3/1992 | Young | 340/783 |
| 5,105,288 | 4/1992 | Senda et al. | 359/57 |
| 5,165,075 | 11/1992 | Hiroki et al. | 359/54 |

OTHER PUBLICATIONS

I.B.M. Technical Disclosure Bulletin <<AC Drive Circuit for an Integrated Liquid Crystal-Silicon Display>> by E. L. Newman.

*Primary Examiner*—Richard Hjerpe
*Assistant Examiner*—Lun-Yi Lao
*Attorney, Agent, or Firm*—Sixbey, Friedman, Leedom & Ferguson

[57] ABSTRACT

An electro-optical display device operating in an active matrix mode, comprising pixels each provided with a first element for selecting the pixel, a second element for supplying electric current to the pixel in accordance with the information transferred from the first element, and a memory element which stores the signal having output from the first element. Also claimed is a method of displaying images using an electro-optical display device operating in an active matrix mode, said method comprising rewriting only the specified pixels, or comprising rewriting only the specified lines during one frame, or comprising taking the period of scanning (addressing) the image plane longer than the period of alternating the polarity of the electric current applied to the pixels.

21 Claims, 8 Drawing Sheets

ELECTRO-OPTICAL DEVICE AND PROCESS FOR FABRICATING THE SAME AND METHOD OF DRIVING THE SAME

BACKGROUND OF THE INVENTION

1. Field of the Invention

The present invention relates to an electro-optical device such as a liquid crystal display device or a similar type of display device and to a method of driving the same. In particular, the present invention relates to a display device operating with an active matrix, a method of displaying images with said device, and a process for fabricating said device.

2. Prior Art

With the increasing demand for various types of more compact and energy-conserving equipments for office automation (OA), the conventional display devices using cathode ray tubes (CRTs) are being replaced by flat panel displays (FPDs) such as liquid crystal displays (LCDs) and plasma display panels (PDPs). Particularly among them, the LCDs are advantageous in that they are least power consuming, and hence are most preferred for use in portable equipments.

However, LCDs have yet numerous problems to be solved. Most of the LCDs which are used in practice at present are those operating in a single matrix, and are sometimes called by the name of the liquid crystal material used therein as STNLCDs (super-twisted nematic LCDs). The STNLCDs have prevailed because they can be fabricated by a simple process and, therefore, at a low cost.

The super-twisted nematic liquid crystals are, however, extremely sluggish by nature, and its poor response fails to display an object moving at a high speed. Concerning its mode of operation, a pixel remains "on" for a duration of from several tens of microseconds ($\mu$sec) to 1 millisecond (msec) per 1 frame (in general, a frame has a duration of from 10 to 30 msec). The duration of the pixel in its "on" state is related to the inverse proportion of the number of lines. Thus, in a matrix consisting of 200 lines, it can be calculated, by assuming 30 msec per frame, that the pixel is "on" for about a mere 150 $\mu$sec. This results in a picture plane of low contrast, and, moreover, in a picture plane which is not visible from an oblique angle. Furthermore, when an extremely bright or dark portion is included in the picture plane, such a portion affects the surroundings; i.e., there arises a problem of "cross-talk".

Recently, the types of LCDs operating on a mode different from the aforementioned single-matrix mode are being proposed and are made commercially available. Those are called collectively as LCDs operating on an active matrix. The pixels in this type of LCDs are each switched individually by their respective active elements which are connected thereto. Those LCDs can be further classified into TFTLCDs and MIMLCDs, according to the type of the active matrix used therein. TFT is an abbreviation for thin film transistor, and MIM stands for a diode having a metal/insulator/metal structure.

The LCDs operating on an active matrix mode has a high contrast, and the visual angle thereof is wide. These are ascribed to the fact that the pixel in those LCDs remains "on" for a duration almost equal to that of the frame. However, those LCDs have technological problems in their fabrication, and hence, the product yield is still too low. Thus, because of high cost and of its being too expensive to purchase, their practical application at present is only limited to the displays of elaborate computers.

It should be noted that, despite the demand for LCDs are now limited principally to portable computers, the market for those LCDs are expected to expand in near future because there would be demands in a wide application field, such as cordless telephones, displays attached to portable telephones, and information displays of electronic dictionaries and the like. Furthermore, apparatuses such as a one equipped with a display having a large image plane for viewing newspapers and other printed matter are also prospects which may establish a large market.

The most important point in making displays feasible in the applications described hereinbefore is not a high quality display having a gradation, but how to conserve energy. However, none of the conventional LCDs were satisfactory on this point, because any of the STNLCDs, TFTLCDs, and MIMLCDs must at least rewrite the image at least once per i frame.

Furthermore, the displays intended for the aforementioned special use are generally used continuously over a long time, displaying the same image. Thus, the power source must be turned off during the idle time of the display to save power. However, on the other hand, it is loss of power transferring image from the memory each time the display is off, and, moreover, it is time consuming to read out the image each time. Accordingly, it is desirable that the display itself has a memory function so that the image may be restored to the display upon its turning on.

A low cost display for this special purpose can be realized by the use of an STNLCD of a conventional type. However, the display would result in a low contrast and visually unfavorable due to its narrow visual angle. Furthermore, the display consumes much energy during the display is on, because a high voltage pulse of 20V or higher is flown to and fro at a frequency as high as 15 kHz.

A TFTLCD may be used in the display above to provide a favorable contrast and visual angle. However, it requires a high cost, and though the pulse voltage may be lowered to 10V or lower, the power consumption is still high.

A ferroelectric liquid crystal (FLC) may be used if a particular emphasis were to be posed on its memory functions. However, an FLC has one problem; even when the image is turned off, the image in the display remains unerased when too long a same image is displayed. Furthermore, the temperature range for an effective operation of the FLC is limited to a very narrow range.

In the applications of displays to personal computers, there are cases in which high response is not required. For example, the image in a word processor does not change so frequently as in the image of a television set. Only a part changes within a period of 1 second. However, in the conventional LCDs, it happens, unnecessarily enough, that the whole image is written and erased as frequently as 30 times per second. In doing so, the signals of the portions which need not be rewritten are processed and transferred. Accordingly, a large load is posed on the function of a display.

Furthermore, in the digital-type displays for images having gradation (sometimes referred to hereinafter simply as "displays operating in a digital gradation mode") filed by the present inventors, an extremely large amount of signals must be processed. These are disclosed in Japanese patent application Nos. Hei 3-157504, 3-157503, 3-157502, 3-157505, 3-157506, 3-157507, 3-163870, 3-163871, 3-163872, 3-163873, 3-169306, 3-169307, 3-209869, and 3-209870. A part of those signals is used not for changing the image, but for maintaining a certain state. It can be seen, accordingly, that an LCD of a conventional type or of a modification thereof would consume a considerable amount of power on its operation at a high speed.

In the case of displaying a high speed motion of only a part of the image, such as displaying a cursor moving at a high speed on the display of a computer, it is required that the frame frequency is increased to not less than the conventional 30 Hz. However, in a conventional LCD, the whole image, inclusive of the static image, should be rewritten according to the frame frequency. Then, it happens that the signal processing function falls behind the movement of the image.

In FIG. 2 is shown schematically the pixel circuit of a conventional TFTLCD using a TN liquid crystal as the liquid crystal material. An example of its mode of function is also shown in the same figure. The TFT and the drain are each connected to a selection line (gate line) and a data line (drain line), respectively, and the source is connected to the pixel electrode. The counter electrode of the pixel electrode is a common electrode which is usually maintained at a constant voltage; in general, it is earthed.

A pulse is periodically applied to the selection line and the information of the pixel is applied to the data line as a voltage signal. This is shown in FIG. 2(B). The period of the pulse which is applied to the selection line corresponds to the period of a frame in the usual operation, and it is typically in the range of from 10 to 30 msec. The width of the pulse is generally about the length of the period being divided by the number of the lines or smaller. In the case of an information display and the like having a relatively small matrix of about 100 lines, the pulse duration is generally in the range of from 100 to 300 $\mu$sec.

The signal is applied to the data line by bringing it into a high voltage state to express the "on" state of the pixel, and applying no voltage to express the "off" state of the pixel. The polarity of the high voltage is periodically changed, i.e., an alternating current is applied. Such a measure is taken, because a TN liquid material undergoes decomposition and degrades thereby if a direct current is applied to the TN liquid crystal material for too a long time.

The source side of a TFT to which a signal above is applied yields a signal $V_1$, as shown in FIG. 2(B). At the initial state, the TFT turns "on" upon receiving a pulse from the selection line, and hence the source voltage increases to reach the drain voltage. However, upon the disappearance of the pulse, a voltage drop of $\frac{1}{4}V$ occurs on the source voltage due to the stray capacitance between the gate electrode of the TFT and the source region. Then, as the TFT turns "off", the pixel electrode becomes electrically isolated and the voltage thereof gradually decreases due to the leak current of the TFT.

Then, as the TFT turns "on" again upon application of a pulse, the source voltage this time approaches to a negative drain voltage. Upon cutting off of the pulse, the voltage shifts to the negative side this time by $\frac{1}{4}V$ due to the stray capacitance as in the case above, and the voltage again is attenuated due to the presence of leak current. Because the drain voltage is zero upon application of the final pulse of the selection line to the TFT, the charge having stored in the pixel electrode is discharged until $V_1$ attains zero voltage.

As described in the foregoing, a TFTLCD basically operates in this manner. However, it is next to impossible to make all the pixels follow the same process in a uniform manner. First of all, the TFT must respond in a short period of time in the range of from 10 to 30 $\mu$sec, and a little difference in the TFT characteristics considerably affects the output source voltage. In a TFT based on amorphous silicon having a small carrier mobility, in particular, the pulse applied to the selection line in such a short period of time is cut off before the pixel electrode is Sufficiently charged.

The amount of voltage drop $\Delta V$ can be related to the stray capacitance $C'$, the pixel capacitance $C$, and the amplitude of the selection pulse $V_G$ by an equation as follows $$\Delta V = C'V_G/(C+C').$$

It can be seen from this relation that the $\frac{1}{4}V$ increases with increasing stray capacitance; hence, as a result, the $V_1$ as a whole shifts to a negative side (or a positive side) with increasing stray capacitance. This leads to the application of a direct current to the liquid crystal. Accordingly, a degradation occurs on the liquid crystal. Moreover, in the case where the frame frequency is about 30 Hz, the image suffers flickers; i.e., the image is alternately turned bright and dark every period of 15 Hz. The most serious problem here is that this $\frac{1}{4}V$ is not uniform for all the TFTs, and this large difference in $\frac{1}{4}V$ between the TFTs considerably reduces the product yield.

If an attempt were to be taken to increase the pulse width of the selection line to solve the aforementioned problems, the frame frequency should be lowered. This can be realized with no particular problem if the display is not intended for moving images. However, the TFT driven at too low a frequency signifies that it is driven substantially with a direct current, and again there is fear of causing damage to the liquid crystal. Furthermore, the charge having accumulated in the pixel electrode undergoes a spontaneous discharge. Accordingly, in practice, the frame period cannot be taken longer than, for example, 1 second.

Ideally, a TFT having fabricated from polycrystalline silicon (polysilicon) in a self-aligned manner is preferred for use because it has a high operation speed and a small stray capacitance. However, the fabrication of such TFTs requires thermal annealing at 600° C. for a long period of time or the use of a special technique such as laser annealing and electron beam annealing. The use of a thermal annealing signifies that the substrate material must be selected beforehand so that the substrate material may endure the heat, and that a material for the metal wiring must be selected from those other than aluminum. An aluminum wiring indeed is most preferred for a metal wiring, but it would be seriously damaged at a temperature as high as 600° C. Thus, the gate electrode must be made from a material selected from materials other than aluminum. Furthermore, thermal annealing requires heating for a duration of 24 hours or even longer. This is also a big problem. Moreover, the thermal annealing at about 600° C. should be followed by a second thermal annealing in a high temperature, as high as in the range of from 900° to 1100° C. This step hence confines the substrate material to quartz. The use of quartz as the substrate material not only limits the area of the display, but also increases the production cost.

In contrast to thermal annealing, laser annealing and electron beam annealing processes are basically low temperature processes and hence are applicable to almost any kind of substrate material. However, both technologies are premature and await a still some time to obtain TFTs with high reliability. Furthermore, they are not suited for mass production.

In realizing the digital gradation according to the previous invention of the present inventors using the circuit shown in FIG. 2, a still faster operation is requisite. More specifically, for example, a digital gradation display with 18 gradation requires an operation speed as fast as 18 times the conventional speed. In this context, it is now believed that no TFT other than a self-aligned type polysilicon TFT is applicable in realizing such a high speed. However, this digital degradation display includes useless operations. In the digital gradation display system, the length of time during the voltage is applied to the pixel is divided, and then the length of each of the divided time segments is controlled so that the effective voltage applied to a pixel is thereby controlled by the duration of applying the voltage. The basic point resides, however, in that the frame frequency is increased as compared with a conventional one. However, most of the operation is occupied by, as in any other conventional LCD display methods, the unnecessary rewriting operation. This as a result consumes large amount of power.

SUMMARY OF THE INVENTION

In the light of the circumstances described hereinbefore, the present invention has been accomplished as a means to overcome the practical limits imposed to the LCDs at the present, and to hence cope with the increasing demand on the LCDs.

Accordingly, an object of the present invention is to provide a black-and-white display (electro-optical device of an active matrix type) which is capable of rewriting only the desired pixels thereof and which has a so-called "resume" function, i.e., which stores the image at turning off the power and restores it upon turning the power on again. In particular, the display economizes on electric power which is used for displaying and retaining the image.

Another object of the present invention is to provide a display which can sufficiently follow objects moving at a high speed. In particular, the present invention provides a display capable of high speed response, suitably used as displays of computer terminals and the like.

Still another object of the present invention is to provide a power-saving display capable of displaying gradation by a digital system.

The present invention aims to provide ultimately several types of LCD devices as follows.

An embodiment according to the present invention provides a display for portable apparatuses, which is characterized by that the display itself has a memory function and that it is visually favorable, yet low in power consumption and in production cost.

Another embodiment according to the present invention provides a display for use particularly in computer terminals. It also is low in power consumption and in production cost. It furthermore utilizes a system which allows rewriting of the selected pixels only.

A still another embodiment according to the present invention provides a display suitable for expressing digital gradation. The power consumption is reduced by taking advantage of a system which maintains the signal at an "on" state without applying additionally an external signal for simply retaining the high-voltage state.

A yet another embodiment according to the present invention provides a display for use especially in computer displays where high speed display is required. A high speed movement of the display is followed by rewriting only the necessary pixels and hence compressing the signals.

Accordingly, the present invention provides an image display device and a method for displaying images different from any of the conventional devices and methods. The devices according to the present invention is characterized by three points; firstly, solving the conflict between how to render the display a memory function and how to apply alternating current to such a display; secondly, establishing a signal compression technique by rewriting only the specified pixels; and thirdly, increasing the allowance in TFT characteristics to use TFTs more efficiently.

The first problem could not be solved by the use of a TFTLCD having the conventional circuit configuration and operation as illustrated in FIG. 2. The application of an alternating current to any type of a static image signifies that the image is turned into a dynamic one, and hence, the image required signals to be supplied continuously to the selection line (addressing line) and the data line.

The second problem could be achieved only after establishing a memory function in the display itself. This point was rarely considered in the conventional technologies. Only few trials have been made on FLCs characterized by their memory functions.

The third problem is meaningless unless the second problem is solved. Accordingly, no consideration was made on this problem in the past. That is, in the conventional technology for TFT fabrication, it had been regarded indispensable to fabricate TFTs of uniform quality to provide favorable TFTLCD. However, such a concept has led to an enormous amount of capital investment to fulfill the TFT production lines with equipments, and companies are now completely at a loss how to recover such investment. The present invention does not intend to blame the concept above, but it rather proposes a novel market which allows use of TFTs of inferior quality.

BRIEF EXPLANATION OF THE FIGURES

FIG. (1A & 1B) show schematically the circuit of an electro-optical device according to an embodiment of the present invention, together with a schematically shown mode of its operation;

FIG. (2A & 2B) show schematically the circuit of a conventional electro-optical device, together with a schematically shown mode of its operation;

Figure 7A:
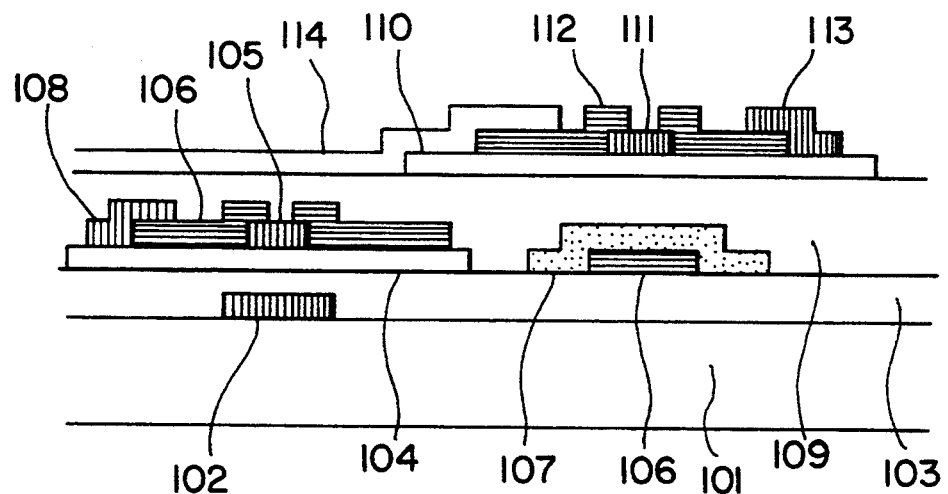
Figure 7B:
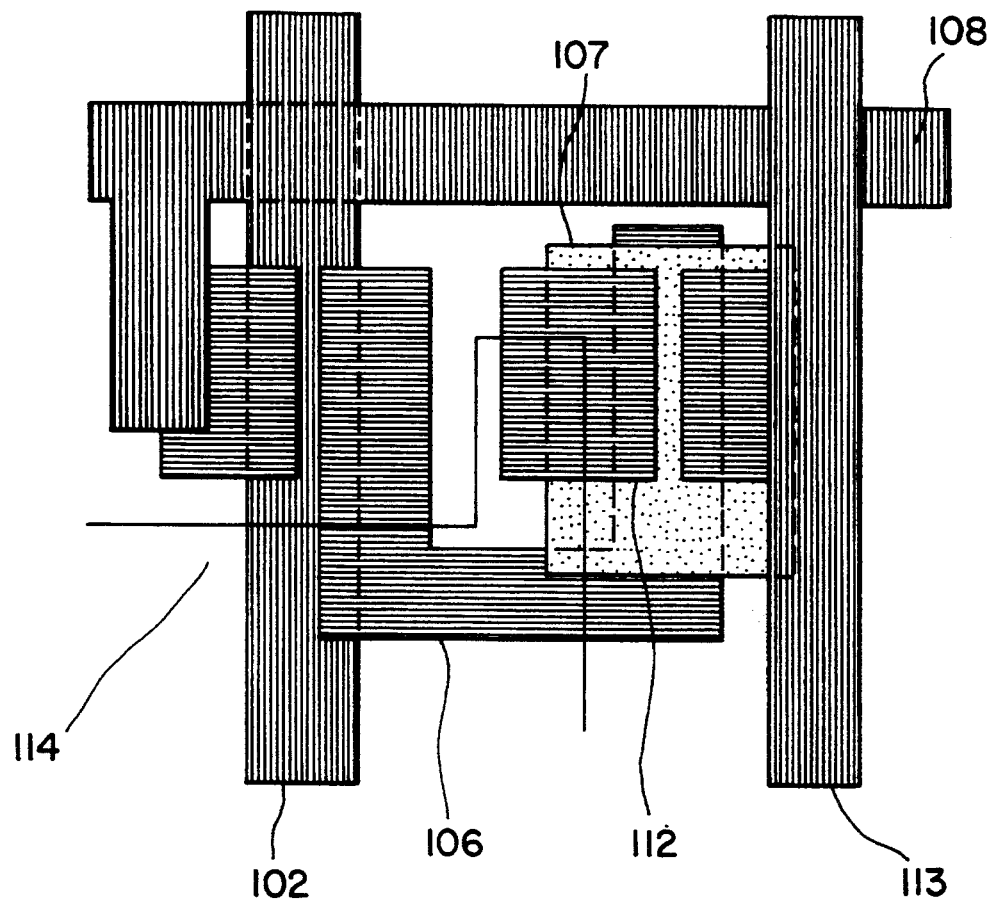

FIG. (3A & 3B) show schematically the mode of operation of an electro-optical device according to an embodiment of the present invention;

FIG. (4A & 4B) shows schematically the circuit of an electro-optical device according to another embodiment of the present invention, together with a schematically shown mode of its operation;

FIG. (5A & 5B) show schematically the circuit of an electro-optical device according to another embodiment of the present invention, together with a schematically shown mode of its operation;

FIG. (6A & 6B) show schematically the mode of operation of an electro-optical device according to another embodiment of the present invention;

FIGS. 7(A) and 7(B) respectively show schematically in cross section view and plan view an electro-optical display device according to an embodiment of the present invention; and FIG. (8A & 8B) show a driving system for LCDs and a data-addressed memory used in the present day computers.

DETAILED DESCRIPTION OF THE INVENTION

A problem in a conventional TFTLCD is, to the knowledge of the present inventors, that a single TFT carries over too many functions. More specifically, a TFT in a conventional TFTLCD has two functions; one is to select a particular pixel, and the other is to supply the electric power to the pixel electrode. It is therefore impossible to further expect on the TFT to achieve two objects at the same time, i.e., rendering the display a memory function and switching the polarity of the high voltage state periodically.

Accordingly, the present invention was taken up first by reconsidering the operation of a TFTLCD. Thus, as the starting point of the present invention, it had been decided to use two different active elements to carry out separately two operations at the same time, i.e., the selection of the pixel and the power supply to the pixels. That is, an active element (a first element) determines which pixel to select, and outputs a signal. Then, another active element (a second element) which supplies an electric power to pixel electrodes receives the output signal from the first element and correspondingly turns the power "on" and "off". Furthermore, a wiring must be newly provided because the function of selecting a pixel is separated from that of supplying an electric power. The present invention is characterized by that a circuit structure explained in the foregoing is used as the basic one to solve the other problems.

The first problem can be solved relatively easily by taking the structure explained above. Accordingly, a non-volatile memory device (non-volatile capacitor) is provided at the output side of the first element, and the output signal from the first element is supplied to the second element via this non-volatile memory (non-volatile capacitor). When the signal from the first element is cut off, the memory device which have stored the signal from the first element, i.e. the output of the first element, continues sending the signal to the second element. In this manner, the second element also continues supplying power to the pixel.

It is also necessary that the power supply is made irrespective of the signal from the first element. The second element must be capable of applying both positive and negative voltages to the pixel electrode. If the second element were to be functioned only by the specific signal applied by the first element, it then becomes impossible to switch the polarity of the voltage periodically. More specifically, if the second element were to be set as to apply negative and positive voltages in accordance with the negative and positive signals sent from the first element, the periodic switching of the polarity requires accordingly signals from the first element each time the polarity is switched. This obviously makes it impossible to render the display a memory function.

The second problem can be readily solved if the problem of rendering the memory is solved. Because a memory is provided to each of the pixels, the amount of signal to be transferred can be considerably reduced. This is particularly apparent in the computer displays and the like, in which the image is almost static. Furthermore, many applications are expected as a variation of a display of this type.

For example, it is possible to rewrite only a specified line (only at least one specific line) of pixels in the image plane during a single frame. Let a 200-line matrix be driven at a rate of 40 frames/second. In the first frame (a frame is 25 msec long) within i second, let lines i to 5 be rewritten while allowing the other pixel lines maintain the former state. Then, in the second frame, lines 8 to 10 are rewritten, and similarly, lines 11 to 15 are rewritten in the third frame. In this manner, the whole image plane is rewritten exactly in one second by rewriting 5 lines per one frame. Thus, the device according to the present invention outputs a signal of 200 lines per i second, and this is in clear contrast with the conventional signal processing device which processes and sends signals corresponding to $40 \times 200 = 8,000$ lines per second. That is, the load per second is considerably reduced. On the other hand, the fact that the image plane changes only once every second may cause some inconvenience to the operator, however, there is almost no problem in using such a display system for a particular use, for example, for simply searching information. From the viewpoint of human response, there is little or no inconvenience if the image plane is rewritten 5 times every second.

Furthermore, in the example above, as the information corresponding to 5 lines are processed within 25 msec, the functioning conditions can be considerably relaxed by using a TFT for the first element. More specifically, instead of reacting to an extremely short pulse of 100 $\mu$sec in a conventional device, the response in the present device need be given to a considerably long pulse of 5 msec.

The use of the display as a computer terminal to rewrite only the specified lines is also a novel mode of usage for display. In the case of an image plane in which only the cursor moves, the signal processing is made only on a specified row of signals. Moreover, the maximum amount of signal is at most 20 lines. This signifies that the load for a signal processing device is considerably reduced, and hence the cursor can be moved far rapidly. This is also in clear contrast to the conventional signal processing which required rewriting of all the pixels within 1 frame. This can be also pointed out as a novel way of using a display which is made possible by the present invention.

The third problem can be solved by setting the second problem. That is, because the load on the signal processing circuit can be considerably reduced by solving the second problem, a low grade element can be made use of as the first and the second elements. In the second example, it has been shown that a considerable reduction of the number of lines which require processing within a unit of time allows an element to have a longer response time.

If an element equal in characteristics to a conventional one were to be used, the fact above signifies that the information can be processed at an yield 10 times as large as that of a conventional amount, or even larger. Accordingly, an advanced technology such as digital gradation can be realized even using a conventional type of TFTs.

Furthermore, the use of a first element in combination with a second one for image display according to the present invention possesses some degree of freedom concerning the control of the burden loaded to the first element. In a conventional device, the burden loaded to a TFT is caused by a pixel capacitance and to change this value is made by changing a pixel itself, and degree of freedom concerning the control of the burden is small.

In the present invention, the burden loaded to the first element is caused by, in addition to the burden inside the element, the burden of the memory element and the burden of the second element. Accordingly, the burden loaded to the first element can be reduced by optimizing them.

In the device according to the present invention, the second element carries out a stationary operation. Thus, there is no problem in displaying images even if somewhat large load were to be applied. The only one element which undergoes a dynamic operation is the first one. The load on the first element can be reduced by using a signal compression technology referred hereinbefore according to the present invention, and, still further, the burden in the operation can be reduced by optimizing the circuit in this manner.

In the present invention, there is no particular restriction concerning the memory elements, and various types of elements can be used. The frequency of rewriting depends on the intended use of the memory. For example, in realizing a digital gradation operation at a rate of 40 frames/second using a display durable for 1,000 hours, a memory which endures to at least $10^9$ times of rewriting appears requisite. In contrast, an information display which rewrites once per second need only to endure a rewriting of about $10^6$ times.

An element using a material such as ferroelectrics which functions as a memory by taking advantage of spontaneous polarization endures to rewriting for $10^{10}$ times or even more. Accordingly, such elements can be used to almost all kinds of purposes. Suitable ferroelectrics include inorganic ferroelectrics such as those of perovskite type including PZT and PZLT, and those of layered structure (e.g., $Bi_4Ti_3O_{12}$), as well as organic ferroelectrics such as poly(vinylidene fluoride) (PVDF) and copolymers of vinylidene fluoride with trifluoroethylene, or copolymers of vinylidene chloride with vinyl acetate. In fabricating the elements with inorganic materials, the process sometimes must be undertaken at somewhat high temperature. If a favorable spontaneous polarization were to be obtained with a PZT, an annealing at 450° C. or higher is requisite.

In realizing a memory by a charging process such as charge implantation, it is well known that the insulator film is damaged by such a charge implantation process. Then, it should be well aware of the fact that the maximum allowable rewriting times drops to about a low $10^6$ times.

It is not favorable in this case to assemble a semiconductor circuit into a memory device, for example, fabricating a circuit such as SRAM by taking advantage of a flip-flop circuit, because it incorporates a complicated fabrication process in the production line.

Also applicable are diodes such as PN diodes, PIN diodes, and MIM diodes, though those are disadvantageous in that they have a short memory retention. Furthermore, there are some cases in which the first element can be used as they are without incorporating an additional element. In such a case, the output signal endures for a predetermined length of time by some reason. For example, if a TFT used as the first element has sufficiently small "off" current, the voltage can be maintained for a considerably long time.

It should be noted, however, that rewriting pixel by pixel in a same line is impossible in such a mode of usage. Accordingly, a line as a whole should be rewritten at once.

The first or the second element is constructed by a TFT alone or an active element such as MIM diode and PIN diode alone or a combination thereof. Otherwise, a combination thereof with a passive element such as a resistance and a capacitor. In a most simple configuration, TFTs are used for both the first and the second elements. An example of a device having such a structure is shown in FIG. 1.

Figure 1A:
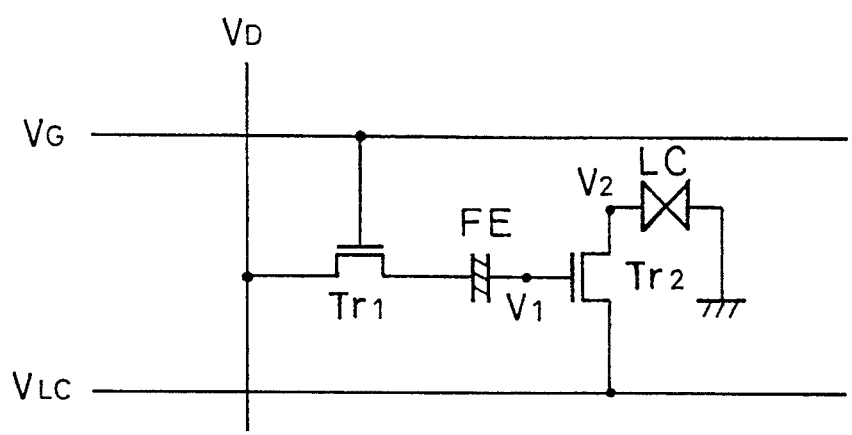

In FIG. 1(A) is shown a structure of a device according to an embodiment of the present invention. It comprises a TFT $Tr_1$ as the first element, and another TFT $Tr_2$ as the second element. The gate electrode and the drain of the element $Tr_1$ are connected to a selection line (addressing line) $V_G$ and data line $V_D$, respectively. The source of the element $Tr_1$ is connected to one end (one of a pair of electrodes) of a memory element, a ferroelectric capacitor FE.

The gate electrode and the drain of the element $Tr_2$ are connected to the other end (the other one of the pair of electrodes) of the ferroelectric capacitor FE and to a voltage supplying line $V_{LC}$ for applying voltage to the pixel, respectively. A ferroelectrics is provided between the electrodes. The source of the $Tr_2$ is connected to one end of electrodes of a pixel capacitor LC. The voltage supplying line is preferably provided in parallel with the selection line.

Figure 1B:
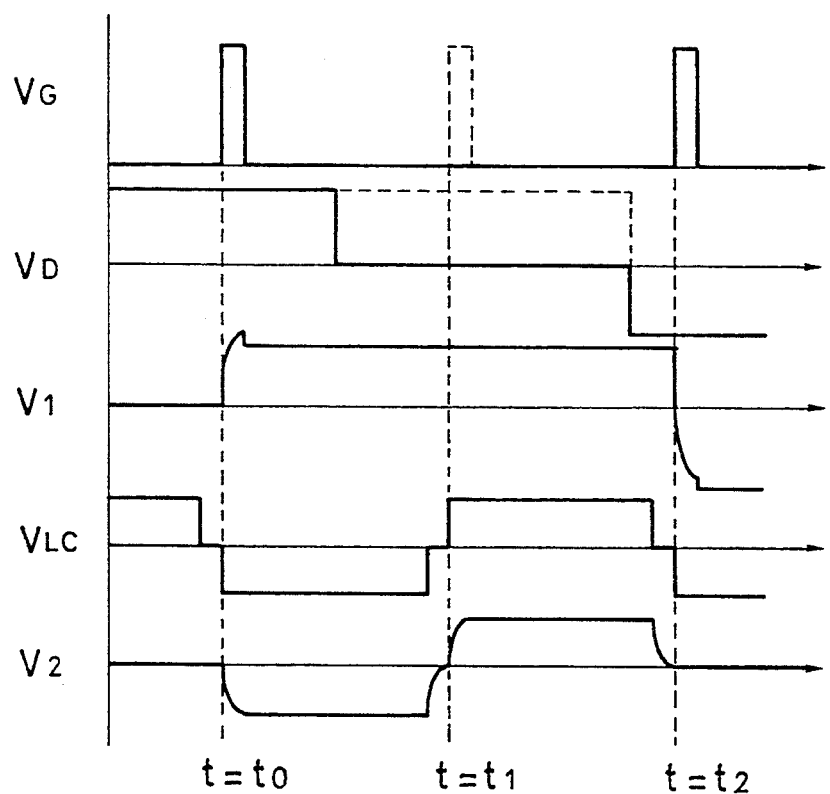
Figure 2A:
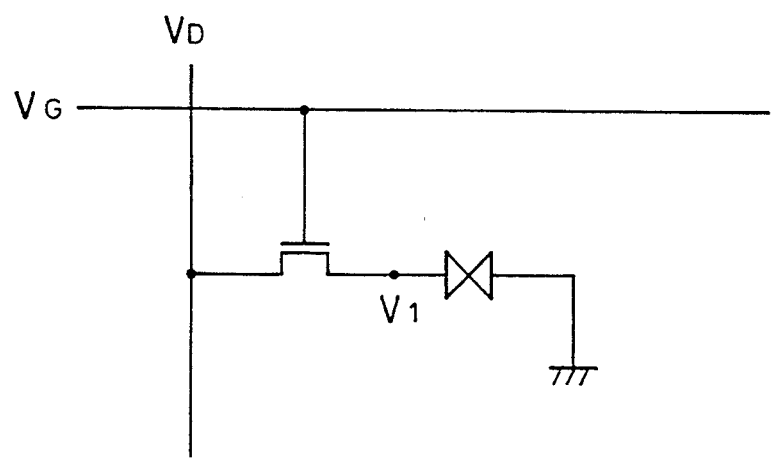
Figure 2B:
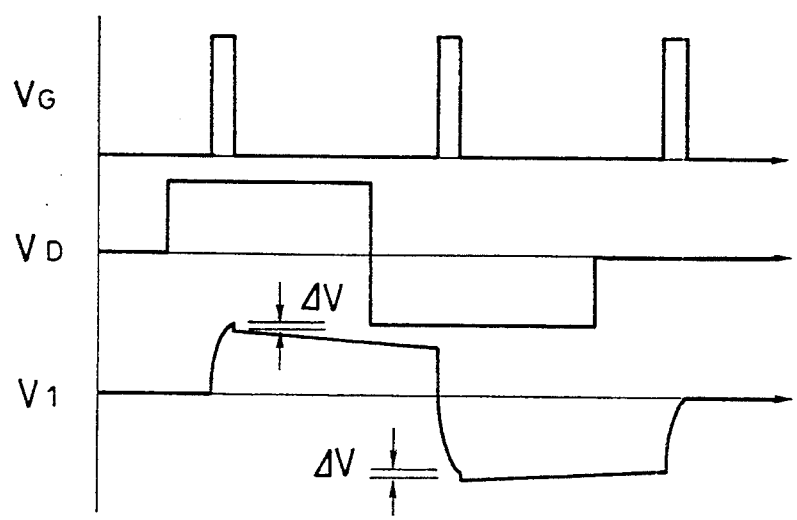

An example of the mode of function of the pixel is given in FIG. 1(B). In this example, the state of the pixel in three frames are described. That is, the pixel is turned "on" in the first frame, the pixel maintains the "on" state in the second frame, and is turned "off" in the third frame. For the sake of simplicity, the voltage of the pixel counter electrode is set to zero. In this example, $Tr_1$ and $Tr_2$ are both of NMOS type.

A pulse is applied to the selection line in the same manner as in the conventional TFTs, whereas a positive or a negative voltage is applied to the data line in accordance to the content of the data. When a pulse of the first frame is applied to the selection line, i.e., at time $t=t_0$, the data line is in a positive voltage state. Thus, the potential of the gate electrode of the element $Tr_2$, which is shown with $V_1$ in FIG. 1(A), increases in the same manner as in a conventional TFT, and decreases upon cutting off the pulse. This potential also decreases due to the discharge through the $Tr_1$. However, because a ferroelectric capacitor FE is provided between the source of $Tr_1$ and the gate electrode of $Tr_2$, the spontaneous polarization of the ferroelectric defines a lower limit for the potential $V_1$. This is the distinctly different point between the device according to the present invention and a conventional TFTLCD.

With the passage of time to $t=t_1$, a second pulse is applied to the selection line. However, if there is no need of rewriting a pixel other than the one under consideration in the same selection line, this pulse may be omitted. The pixel maintains its "on" state without applying any pulse. The reason for this is explained hereinafter.

In the third frame, the pixel must be turned "off." At time $t=t_2$, a pulse must be applied to the selection line. In the meantime, a negative voltage is applied to the data line to turn the pixel "off". It can be seen that the potential of $V_1$ is maintained to a constant positive value until $t=t_2$ by the ferroelectric capacitor, but after $t=t_2$, the polarity of the ferroelectric is reversed to give a negative value because the source is then charged negatively by the signal transferred through the data line.

In this stage again, as the case was in the first frame, the potential has a predetermined upper limit due to the spontaneous polarization of the ferroelectric.

In the device according to the present invention, the drain of the element $Tr_2$, which is in charge of supplying electric power to a pixel, is connected to a voltage supplying line $V_{LC}$. As illustrated in the figure, the electric potential applied to the drain changes synchronously with the pulse in the selection line, and the polarity thereof is reversed frame by frame. This signifies that an alternating current is applied to the pixel. More specifically, the polarity in the first frame (from time $t=t_0$ to $t=t_1$) is negative, but it turns to positive in the second frame (from $t=t_1$ to $t=t_2$), and then again it turns to a negative state in the third frame (after $t=t_2$). Furthermore, the pixel is turned "on" at almost the same time with the application of a pulse of the selection line, and is turned off a little in advance to the instant another pulse is applied from the selection line.

In the first frame, $V_1$ is charged to a positive polarity. Accordingly, $Tr_2$ is in an "on" state to give a negative potential $V_2$ (substantially the same as the pixel potential) by the voltage applied to the voltage supplying line $V_{LC}$. in this case, the voltage attains a constant value after passage of some time because there are a pixel capacitance and an "on" resistance in the element $Tr_2$. Furthermore, the potential of the pixel is maintained substantially the same as that of the voltage supplying line. It can be seen accordingly, in contrast to a conventional case, that a stable image can be obtained without suffering problems such as a fluctuation in the pixel potential due to the discharge, and a formation of an asymmetric potential due to a stray capacitance. Thus, the potential of the voltage supplying line immediately before entering the second frame becomes zero. Accordingly, the negative charge having accumulated in the pixel is discharged.

In the subsequent second frame, no signal is applied to the selection line, and likewise, no signal is applied to the data line. Thus, $V_1$ maintains the state of the first frame by the spontaneous polarization of the ferroelectric. Otherwise, if a pulse should be applied to the selection line, the potential at the source side of the $Tr_1$ remains approximately at zero, but that at the gate electrode of the element $Tr_2$ keeps the state at the first frame (keeps on its memory) because of the spontaneous polarization of the ferroelectric capacitor. Thus, the $Tr_2$ maintains the "on" state, and the pixel this time possesses a positive potential.

The potential $V_1$ in the next third frame is inverted to show a negative value. Thus, $Tr_2$ is turned "off". As the potential supplying line has a zero potential just before entering the third frame as in the second frame, the charge having stored in the pixel before entering the third frame is sufficiently discharged. Accordingly, the charge remaining in the pixel is small enough at the point $Tr_2$ is turned "off."

As shown in FIG. 1(B), the pixels are rewritten by applying a pulse to a gate electrode of a first transistor $Tr_1$ only after changing a polarity of an alternating electric potential and while applying the alternating electric potential to the drain of the first transistor $Tr_1$, and applying a zero voltage to the drain of a second transistor $Tr_2$ before the application of said pulse. In FIG. 1(B), the pixel is written between a zero potential and an alternating potential by applying a zero potential and a positive potential and a negative potential to the drain of the second transistor $Tr_2$.

In case there is no memory element such as a ferroelectric capacitor provided, the potential $V_1$ is attenuated with the passage of time. This requires signals being input into the selection line and the data line consecutively in each of the frames as are shown with broken lines in FIG I(B). Those troublesome operations can be eliminated by implementing a memory element to the device.

However, if the charge loss due to spontaneous discharge is still negligible, the device can be operated free of a memory element yet fully making the best of its memory function. That is, for example, if the time constant of the "off" resistance of $Tr_1$ and that of the capacitance between the gate electrode and the channel region of $Tr_2$ were to be 1 second or longer, the device can be used in such a mode that the image plane is renewed once every second. To carry out the operation in such a mode, an amorphous silicon TFT having a high "off" resistance is preferably used for the $Tr_1$. A high "off" resistance signifies a high "on" resistance at the same time, but this is of no problem in this case, because the pulse width of the selection line can be taken extremely large as compared with a conventional one. Thus, a sufficiently long time can be taken for the operation even with a large "on" resistance.

In an amorphous silicon TFT, for instance, an "off" resistance of $10^{13} \Omega$ can be set. If a $Tr_2$ having an electrostatic capacity of $10^{13}$ F were to be used, a time constant of 1 second is then obtained. Accordingly, it takes 22% of the time constant, i.e., 0.22 second, to attain a decrease in potential of 80%. Accordingly, it takes 0.36 second and 0.51 second to obtain 70% and 60% value of the initial potential, respectively.

The capacity of an ordinary liquid crystal pixel is about $10^{-13}$ F. If a $Tr_2$ having an electrostatic capacity of $10^{-14}$ F were to be used for the purpose of reducing the driving load of $Tr_1$, the time constant becomes 0.1 second. In such a case, the device can no longer be used with a memory function. However, in a normal operation of about 30 frame/second, the potential drop of the gate electrode of a $Tr_2$ within a frame can be maintained at about 30% without any particular problem.

A device having provided with a ferroelectric memory element can effectively display images with the gate electrode of the $Tr_2$ being maintained at a constant potential even after a passage of one year or even longer. This signifies that the display can be fully restored at the point a voltage is applied to the voltage supplying line, even if once the display is completed and the power being turned off.

Those display devices can be applied as displays of portable telephones, as well as those of electronic memos and electronic dictionaries. Most strongly desired to those devices are that they provide easily understandable images and that they consume low power, whereas quick movement of the images and images with gradation are not highly estimated.

The conventional STNLCDs are not ideal from the points above. More specifically, as mentioned earlier, an STNLCD has a narrow view angle and a low contrast that they are not favorable from the view point of providing readily understandable images. Furthermore, it consumes a large amount of power because it rewrites the image so frequently as 30 times per second. A TFTLCD can provide a more readily understandable image, however, it still consumes a large amount of power as compared with that of the device according to the present invention.

In the device according to the present invention, it can be seen from FIG. 1(B), at the second frame, that no signals are applied to both the selection line and the data line while the device is at a static state in which no rewriting operation is conducted. An alternating current pulse is applied to the voltage supplying line at the meantime, however, the power consumption for this operation is about the same as that of a selection line of a conventional TFTLCD. Thus, it can be seen that the device according to the present invention consumes less power, lower by the amount of the output signal of the data line as compared with the power consumption of a conventional TFTLCD. In a conventional TFTLCD, the internal memory circuit had to be put into operation to rewrite the display 30 times per second. Accordingly, the device as a whole had to consume a large power. In contrast to such a conventional device, the device according to the present invention can economize on power because the display itself has a memory function, and hence, the only required operation during the static state is to apply a pulse to the voltage supplying line.

Furthermore, the display according to the present invention can restore the former image, even after the power is once off, by applying an alternating current pulse to the power supplying line again. In a conventional TFTLCD based on a display having no memory function equipped by itself, the data had to be read again from an internal or an external memory device if the power of the device was once turned off. Accordingly, it can be seen that a conventional type device not only takes some time to be set up, but also that it consumes a large power. The device according to the present invention is advantageous from the viewpoint of high operating speed and low power consumption.

An LCD panel fabricated using the display device according to the present invention need not be supplied with an external signal for retaining the displayed image because of, as mentioned earlier, the memory function the display itself has. By making the most of this function, only a specified pixel can be selectively rewritten. Accordingly, the smaller the number of pixels (pixel lines) to be rewritten, the more can the device economize on the amount of externally supplied signals. This is illustrated more specifically below referring to FIG. 3.

Figure 3A:
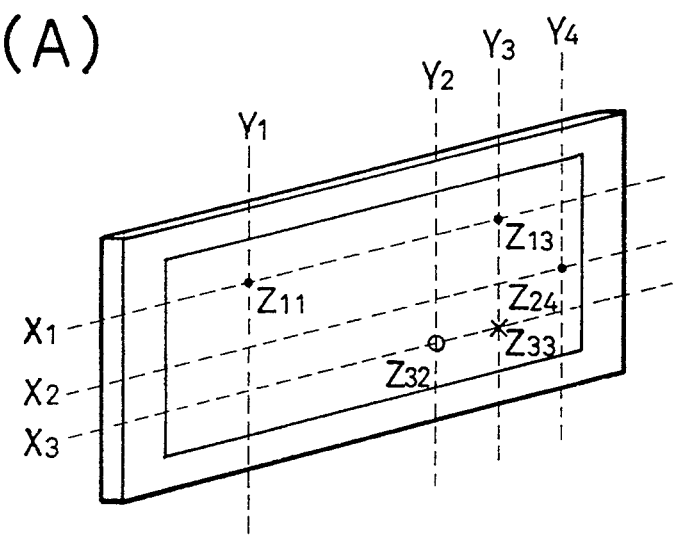

In FIG. 3(A), an LCD comprises selection lines $X_1$, $X_2$, and $X_3$, and data lines $Y_1$, $Y_2$, $Y_3$, and $Y_4$. Suppose that in a frame, only the four pixels $Z_{11}$, $Z_{13}$, $Z_{24}$, and $Z_{32}$ located at the crossings of the selection lines and data lines above need rewriting. More specifically, suppose that the pixels $Z_{11}$, $Z_{13}$, and $Z_{24}$ are turned "on" from their "off" state, and the pixel $Z_{32}$ is turned "off" from its former "on" state. In the meantime, the other pixels remain unchanged. Thus, there is no need of sending signals to the selection lines and data lines of the other pixels, but only a voltage is applied to the voltage supplying line at a pertinent timing.

Figure 3B:
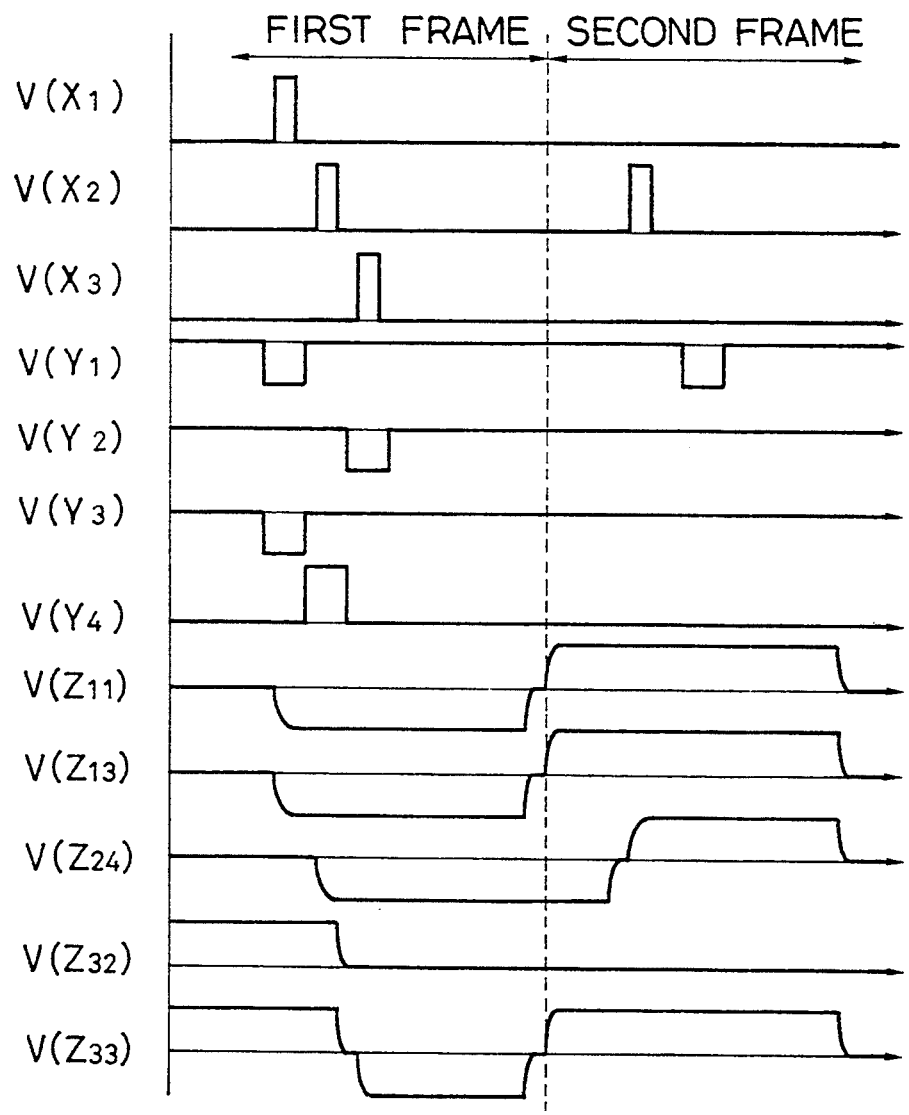

In FIG. 3(B) is shown the states of each of the selection lines, data lines, and the pixel signals. In the figure, $V(X_n)$ represents the signal on a selection line $X_n$. Only the selection lines $X_1$, $X_2$, and $X_3$ referred above send the selection pulses. Accordingly, pulses are applied to those three selection lines, each in a differed timing.

With respect to the data lines, only the above data lines $Y_1$, $Y_2$, $Y_3$, and $Y_4$ are supplied with a data during this frame. Each datum thus supplied to the data lines is either a positive or a negative signal according to the content of rewriting and the selection pulse. Thus, a negative or a positive voltage is applied if the pixel is to be turned "on" or turned "off", respectively. In the figure, $V(Y_m)$ represents the signal of a data line $Y_m$.

Though not shown in the figure, each of the TFTs $Tr_1$ is operated based on those signals in the manner described above, thereby inverting the polarity of each of the ferroelectric capacitors being provided between the source of the $Tr_1$ and the gate electrode of the $Tr_2$. The $Tr_1$ and the $Tr_2$ in this LCD are preferably NMOS-type TFT and PMOS-type TFT, respectively. Accordingly, the gate electrodes of the TFTs $Tr_2$ in the pixels $Z_{11}$, $Z_{13}$, and $Z_{24}$, which have been previously charged to a positive polarity, change their polarity to negative, whereas in the pixel $Z_{32}$, the gate electrode changes its polarity from negative to positive. In this manner the $Tr_2$s for former three pixels are turned "on", and the one for the latter one pixel is turned "off". A similar operation can be conducted by using a TFT of a depression type.

The voltage from the voltage supplying line is applied synchronously with the selection line pulse, as was shown before in FIG. 1. Suppose that a negative voltage is applied in this frame. Accordingly, the potential of the voltage supplying line before applying the pulses of the selection lines is temporarily brought to zero voltage, and the charge having stored in each of the pixels is discharged in the meantime to also bring the potential of the pixels to zero voltage.

Then, in this manner, each of the pixels displays its own state according to the signals supplied thereto. As the pixels $Z_{11}$, $Z_{13}$, and $Z_{24}$ are turned "on", the potential of those pixels become equal to the potential of the voltage supplying line. The pixel $Z_{32}$, on the other hand, is turned "off" that the potential thereof maintains zero voltage irrespective of the potential of the voltage supplying line. The other pixels keep the former display on because the potential of the gate electrode of $Tr_2$ remains unchanged.

A pixel $Z_{33}$, which is in the same line with the pixel $Z_{32}$, maintains the former "on" state because, despite the applied pulse from the selection line, no pulse from the data line is applied thereto. Thus, the pixel potential thereof changes with the voltage of the voltage supplying line. In the figure, $V(Z_{nm})$ represents the potential of a pixel $Z_{nm}$.

With respect to the pixels other than those in the line under consideration, a same single may be applied at the same time at the initiation of a frame to all the voltage supplying lines other than the lines to which a selection pulse is applied during the frame.

Otherwise, another method may be adopted, in which the same signal as that of the voltage supplying line for $X_1$ is applied to lines from $X_1$ to a line just before the line $X_2$, the same signal as that of the voltage supplying line for $X_2$ is applied to lines from $X_2$ to a line just before the line $X_3$, and the same signal as that of the voltage supplying line $X_3$ is applied to the lines $X_3$ or beyond.

In the embodiment illustrated in FIG. 3, the former method was employed. The pixel voltage of the pixels other than pixel $Z_{24}$ is reversed upon completion of the frame. Because a pulse is applied to the selection line $X_2$ in the subsequent frame, a voltage is applied in such a manner that the voltage supplying line may synchronize with the selection line $X_2$. As a result, the inversion of the voltage in the pixel $Z_{24}$ begins rather delayed from that in other pixels.

In the embodiment referring to FIG. 3, three lines were rewritten. However, four more lines can be rewritten at the same time because the period for a frame still affords for four such lines. If rewriting of further more lines is necessary, a measure such as extending the frame period can be taken.

Figure 4A:
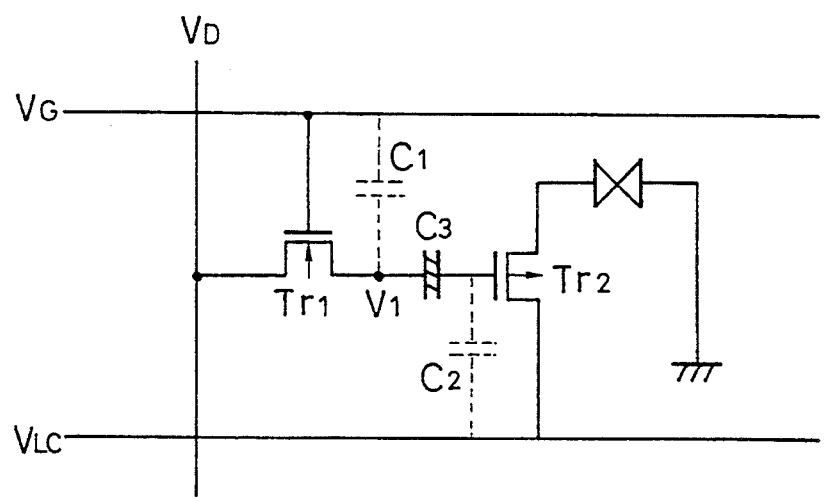

As mentioned hereinbefore, the load applied to the first element can be reduced in the device according to the present invention by appropriately combining the first and the second elements. Suppose, however, that a circuit as shown in FIG. 4 is incorporated with an aim to lower the capacity $C_2$ of the $Tr_2$ gate electrode to thereby reduce the load of $Tr_1$. In this configuration, a capacitance $C_3$ of the memory element (such as a ferroelectric memory) is also present. However, the total capacity $C'$ of the serial-connected capacitors amounts to about $C_2$ or $C_3$. When this capacity $C'$ is too small, the stray capacitance $C_1$ which results from the overlapping of the gate electrode and the source region in $Tr_1$ sometimes becomes too large to be neglected.

The source voltage fluctuates as $\Delta V$ by the presence of the stray capacitance $C_1$ in accordance with the following equation $$\Delta V = C_1 \cdot V_G / (C_1 + C')$$

where $V_G$ is the gate voltage In an extreme case, $\Delta V$ may amount to about 50% of the gate voltage. In FIG. 4 is illustrated such extreme case, but it can be seen that the curve shape for the source potential $V_1$ of the $Tr_1$ is greatly differed depending on whether the signal applied to the drain is positive or negative. In FIG. 4 is shown specifically a case in which the fluctuation amounts to 40% of the voltage of the selection pulse due to the presence of a stray capacitance.

In the device according to the present invention, a stray capacitance is not a serious problem if, at least temporarily, the source voltage is brought to a memory level of the memory element or higher, because the polarity of the memory element may undergo transition. More specifically, for example, the state of a ferroelectric capacitor used as a memory element can be changed by applying an electric field of a certain intensity or higher to the ferroelectric. This signifies that the application of a voltage of a certain intensity (shown with a dot-and-dash line in FIG. 4(B)) or higher to the ferroelectric capacitor sufficiently removes the problem of a stray capacitance. Since the pulse in a selection line has a width of 50 $\mu$sec or more in a normal-mode display, the transition of the ferroelectric memory can be sufficiently completed.

In a display driven in a higher speed, however, there sometimes occurs that the transition cannot be fully completed. In displaying a digital gradation, for example, a high speed pulse about several tens to several hundreds of times faster than the normal pulse is transferred. In such a case, the pulse width may sometimes become 1 $\mu$sec or shorter; as a result, it sometimes happens that the ferroelectric memory fails to sufficiently complete the transition.

Figure 4B:
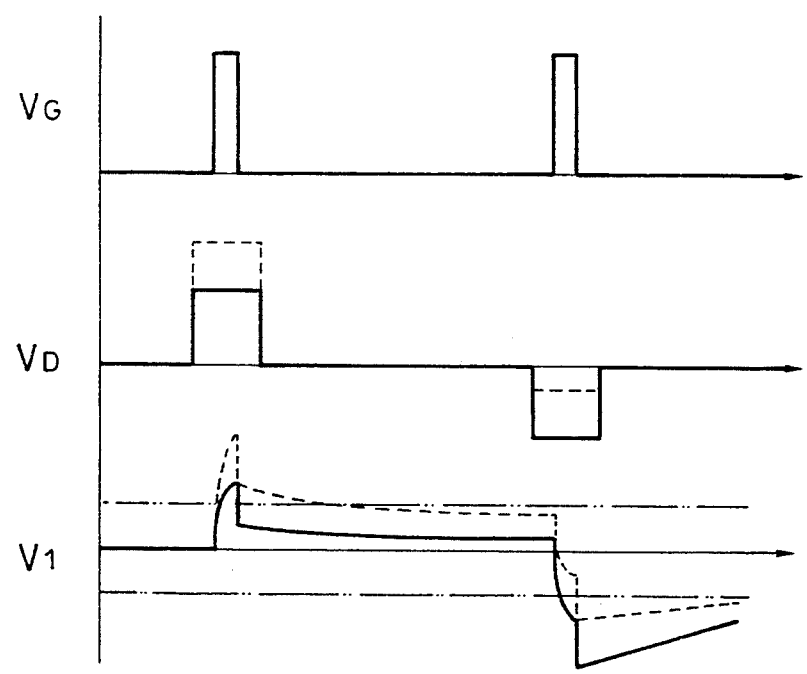

The problem above can be solve, for example, by controlling appropriately the levels of the positive and the negative signals as illustrated with the dotted line in FIG. 4(B), to thereby provide the ferroelectric with a sufficiently high voltage and a sufficiently long time. For example, by elevating the level of the positive data signal, the $V_1$ shifts to the upper side. If there is any inconvenience concerning a too large negative signal, the negative data signal may be maintained to a level symmetrical to the positive signal.

Those minor changes in design can be readily carried out after the panel is fabricated, by simply changing the signal voltage.

Figure 5A:
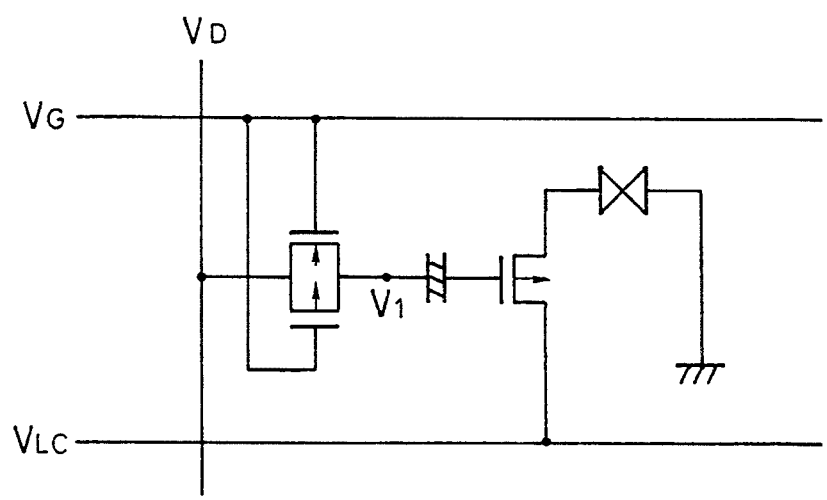
Figure 5B:
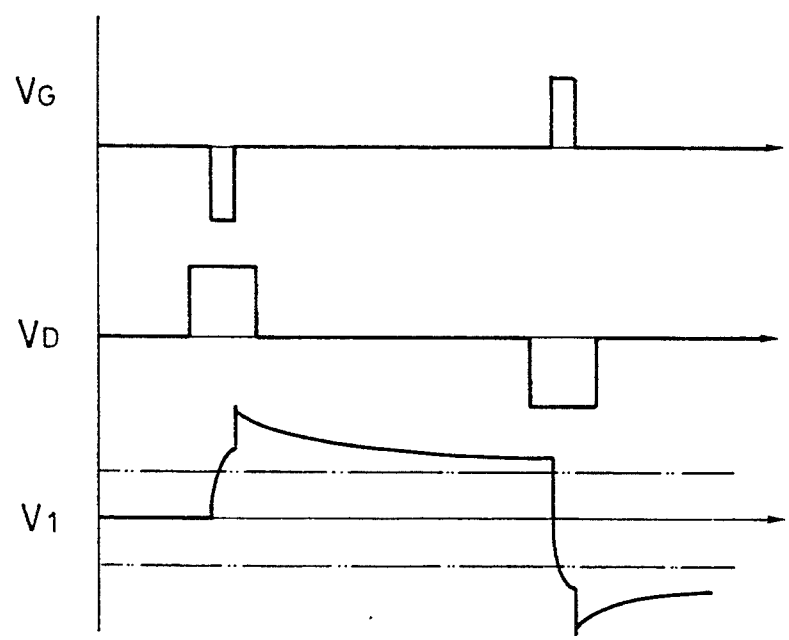

Furthermore, as the problem above arise from the asymmetrical nature of the TFT, an improvement can be made by an NMOSTFT (n-channel transistor) and a PMOSTFT (p-channel transistor) as the first element to give a CMOS transfer gate, instead of using a single TFT for the $Tr_1$ as shown in FIG. 5. In FIG. 5, gate electrodes of the NMOSTFT and the PMOSTFT are connected with the selection signal line $V_G$, one of source and drain regions of each of the NMOSTFT and the PMOSTFT is connected with the data signal line $V_D$, and the other one of the source and drain regions of each of the NMOSTFT and the PMOSTFT is connected with the capacitor. In such a case, a negative pulse is applied to the selection line when a positive signal is applied to the data line, and a positive pulse to the selection line when the data line signal is negative. Otherwise, a bipolar pulse comprising a monolith of a negative and a positive pulse may be applied.

The foregoing descriptions were made for a black-and-white binary display. In the device structure according to the present invention, the information is transferred to and fro between the first and the second elements by way of a static "on" and "off". Accordingly, it is next to impossible to supply an analog voltage to the pixels. Thus, a gradation display can be obtained only by way of digital gradation. For details on digital gradation, reference can be made to the inventions filed by the present inventors, as disclosed in Japanese patent application Nos. Hei 3-157504, 3-157503, 3-157502, 3-157505, 3-157506, 3-157507, 3-163870, 3-163871, 3-163872, 3-163873, 3-169306, 3-169307, 3-209869, and 3-209870.

A method of displaying an image with a digital gradation using an embodiment according to the present invention is described below. Referring to FIG. 1, NMOSTFTs were assembled to the pixel as the first and the second elements. To obtain a better understanding, two pixels neighboring to each other in the same line are taken for the explanation. In this case, the selection line and the voltage supplying line are common for both pixels. The data lines for the two pixels are different, and are indicated with $V_D$ and $V_D'$. The gate electrode potential of the $Tr_2$ for the first and the second pixels are each shown as $V_1$ and $V_1'$; the source potential for the $Tr_2$, which is substantially the pixel potential, for the first and the second pixels are each In FIG. 6 is schematically shown a method for displaying images in 8-gradation, in accordance with the method of the inventions of the present inventors, as disclosed in Japanese patent application Nos. Hei 3-157504, 3-157503, and 3-157502. The method of displaying images in digital gradation is not limited to those above, but since the basis for the operation is the same, reference to individual examples are not made herein.

Referring to FIG. 6, the timing is set in such a manner that seven pulses are applied to the selection line $V_G$ in a single frame. However, not all the pulses are necessarily applied in a practical operation. In a conventional type of expressing gradation digitally, the signal had been sent to the selection lines and data lines only for the purpose of maintaining the high voltage state of the pixel. However, as described hereinbefore in the method according to the present invention, such an operation for maintaining the pixel voltage is not necessary anymore because the pixels themselves have a memory function.

Figures 6A, 6B:
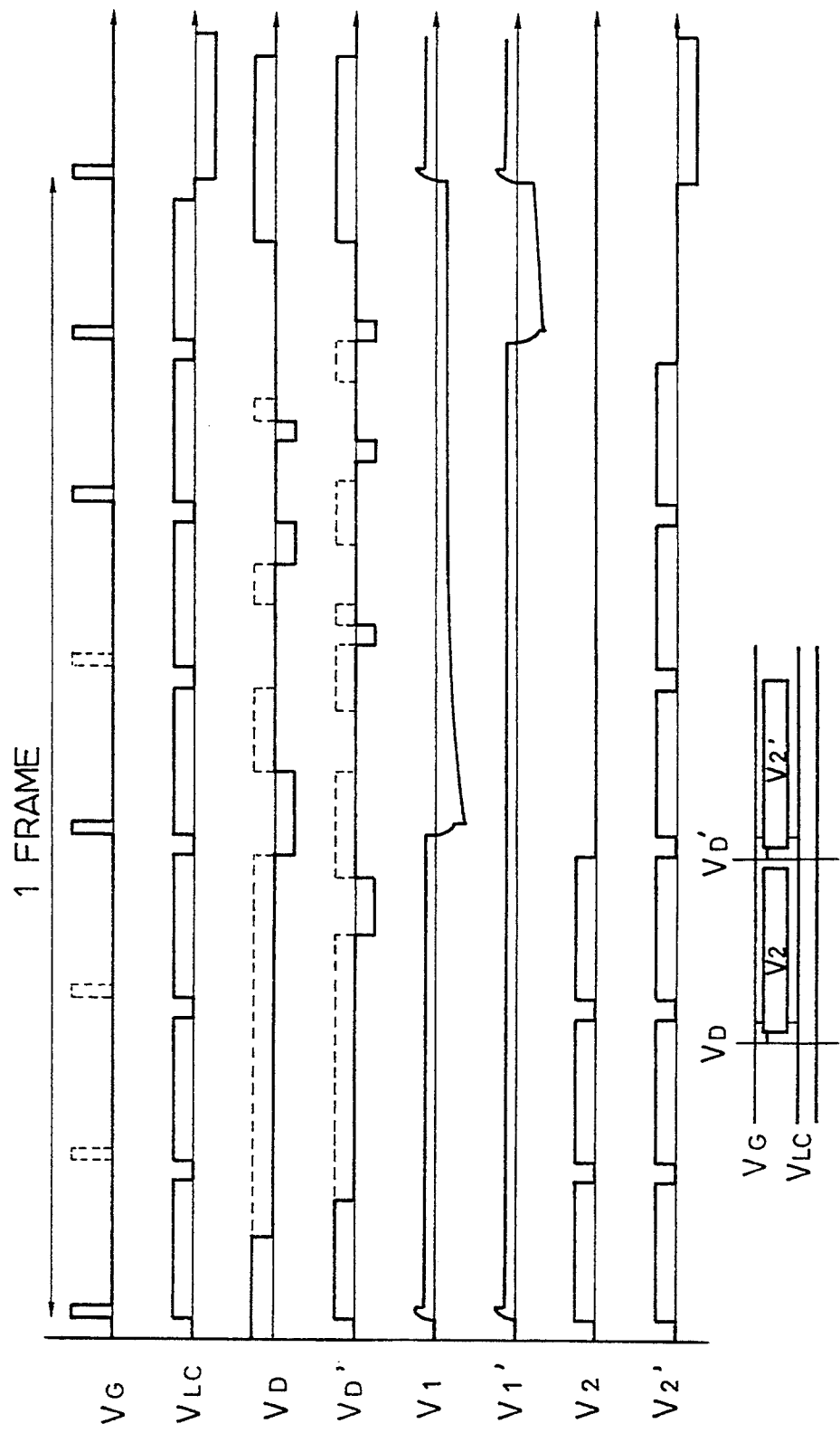

In the method according to the present invention, a pulse is applied only when a pixel in the selection line requires rewriting. Accordingly, in the embodiment referred herein, as shown in FIG. 6(A) and 6(B), the first pulse is indispensable for writing (turning "on") the pixels inclusive of the one under consideration. However, the second, the third, and the fifth pulses are not transferred. The signal for displaying an image in accordance with a conventional digital gradation method is shown with the broken lines. The fourth and the seventh pulses are used for erasing (turning "off") the first and the second pixels, respectively, and the seventh pulse is used for erasing the other pixels in the same line.

As was shown above, because there is no need of sending useless pulses in the method according to the present invention, the load to be applied to the driver circuit can be considerably reduced. On the other hand, a pulsed signal is sent regularly to the voltage supplying line $V_{LC}$ so that it may synchronize with the selection line $V_G$. Upon completion of a frame, the polarity of the pulse is reversed to make an alternating current.

The same applies to the data line $V_D$. Once a positive voltage is input to the data line for the first writing in the frame, no other signal is necessary to be input until a negative voltage is applied for erasing. It can be seen that the signal waveform obtained in the method according to the present invention is far simpler than the one shown with a broken line, which corresponds to that in a conventional digital method of displaying images having gradation. The first pixel is erased upon the application of the fourth pulse in the selection line, and the second pixel is erased by the seventh pulse. Accordingly, a negative voltage is applied to each of the data lines in correspondence to the fourth and the seventh pulse.

The signals $V_1$ and $V_1'$ which are obtained as a result from the signals applied by the selection line and the data line, are shown in FIG. 6(A) and 6(B). It can be seen therefrom that the polarity is reversed upon application of a negative signal to the data line. As a result, the $T_{r2}$ is turned "off" upon applying a negative signal, and the potential $V_2$ and $V_2'$ of the pixel also changes accordingly as shown in the figure. That is, the first pixel is maintained at the "on" state for three periods, and the second pixel is turned "on" and retains the "on" state for a duration of six periods. This signifies that the first and the second pixels have displayed a four- and a seven-step gradation, respectively, in the eight-step gradation. For example, a one-step gradation corresponds to a case in which the pixel is never turned "on", and an eight-step gradation corresponds to a case in which the pixel is always "on."

It can be understood from the foregoing description that the present invention is particularly effective in realizing a gradation display by a digital method. It is of course possible to increase the gradation steps, and, in particular, the advantage of the device according to the present invention can be fully exhibited by decreasing the amount of the signal, thereby reducing the load on the peripheral circuit.

By adopting the present invention, not only in the case for displaying gradation image by a digital method, but also in realizing a normal display, the signals on the selection lines and the data lines can be omitted to some extent. A logic circuit is necessary for excluding some of the signals. An example of the method of carrying out data compression is shown in FIG. 8.

Figure 8A:
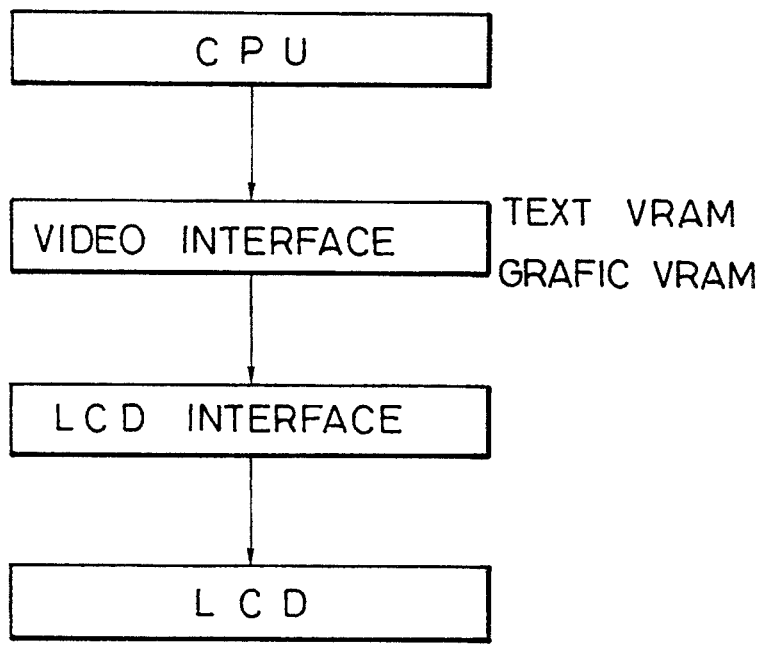
Figure 8B:
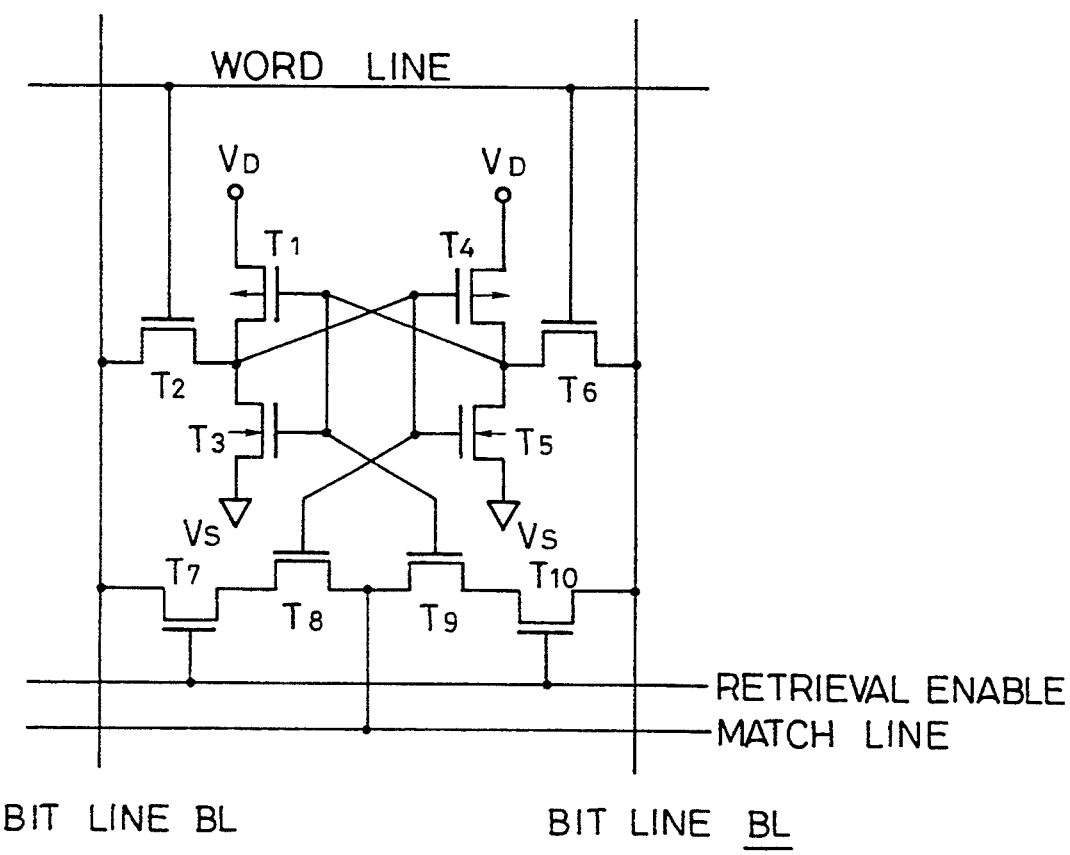

A control system for a computer display widely used in the art is shown schematically in FIG. 8(A). In this system, the image signal having transferred from the central processing unit (CPU) to the video interface is stored in the VRAM thereof. Then, a signal is output from the VRAM to the LCD through the LCD interface in such a manner that it may synchronize with the frame frequency. Thus a signal is output from the CPU in accordance with the frame frequency.

Because the LCD is driven in a conventional manner in a prior art device as above, the advantage of the present invention cannot be fully exhibited; i.e., the signal cannot be input into the LCD in a reduced amount. Accordingly, the video interface must be devised in a special manner. The simplest way of modifying the video interface is to construct the VRAM with a data-addressed memory. A data-addressed memory is a memory device which searches whether there is a word having a data sequence which matches or resembles the input data sequence, the address and the number thereof, and which outputs the searched result in a single cycle. As shown in a scheme of a data-addressed memory given in FIG. 8(B), the memory comprises an SRAM cell having provided with a searching function. That is, as is shown in the figure, it comprises CMOS-type SRAM cells $T_1$ to $T_6$, and the memory information thereof are collated in $T_7$ to $T_{10}$.

The basic mode of operation of the data-addressed memory as a RAM is essentially the same as that of a CMOS-type cell. All the search enable lines (retrieval enable lines) are set to a low voltage level (L level). All the word lines are set to L level, whereas the search enable line and the matching line are set to a high voltage level (H level). In this state, the data are input into the bit lines to be searched, whereas the bit line pairs which correspond to the bit which are not to be searched are maintained at H level. If a data mismatch is found in the searched bits, and if the memory data is "1", the potential of the matching line is drawn by the L level side of the bit line pair through $T_7$ and $T_8$, because in this state $T_8$ is "on", and the bit line BL is set to an L level. If the memory data is "0", the potential of the matching line is drawn by the L level side of the bit line pair again, but through $T_9$ and $T_{10}$. It can be seen, accordingly, that the matching line is maintained at an H level only when all the searched bits are found without any mismatching.

In this manner, every data (memorized in VRAM) being displayed in the LCD by each of the selection lines are looked up whether it contains any data which match with the data being transferred from the CPU, and if the received data is found to be matching, no output is done on the LCD. If the received data is found to be not the same, an output is done on the LCD and the new data is written in the VRAM. In this manner the pulses to the selection lines and the amount of data sent to the data lines can be reduced.

The present invention can be practiced with an aid of a known thin film semiconductor technology. The details for a practical operation is not referred herein, but devices with a variety of types can be obtained by combining the processes known in the thin film semiconductor technology. For example, a high-speed device can be obtained by using an NMOSTFT (or PMOSTFT) as the $Tr_1$ and a PMOSTFT (NMOSTFT) as the $Tr_2$, thereby taking advantage of the complementary effect.

It is also favorable to use an enhancement-type TFT (thin film transistor) as the $Tr_1$ and a depression-type TFT (thin film transistor) as the $Tr_2$. Otherwise, a polysilicon TFT (thin film transistor) capable of high-speed operation can be used as the $Tr_1$ and an amorphous-silicon TFT readily available and having a large "off" resistance as the $Tr_2$. Ideally, the TFTs for both $Tr_1$ and $Tr_2$ are made of polysilicon TFT, however, with a present-day technology, polysilicon TFTs are only available with a low "off" resistance. There is therefore feared that a charge may flow into the pixel by the leak current. To cope with this problem, the alternating current is preferably applied at a frequency of 10 Hz or higher, but it is also effective to use an amorphous-silicon TFT having a high "off" resistance in the place of the polysilicon TFT.

It is favorable from the viewpoint of reducing the fabrication cost to use amorphous-silicon TFTs for both $Tr_1$ and $Tr_2$. Furthermore, the use of a polysilicon requires, except for the case using a special technique such as laser annealing, a high temperature of 800° C. or even higher for the fabrication of the polysilicon itself. This high temperature process considerably reduces the selection range for the substrate materials. Thus, amorphous-silicon TFT is superior to polysilicon TFT from the viewpoint of mass production. However, an amorphous-silicon TFT has a low switching speed, and hence it is desired to use it in an application field permissible of such disadvantage.

Now the invention is described in further detail making reference to a non-limiting example below. It should be understood, however, that the present invention is not to be construed as being limited to the following example.

EXAMPLE

Referring to FIGS. 7(A) and 7(B) pertinent substrate 101 was patterned using a mask 1 to establish thereon a selection line 102 which later became a gate electrode and a wiring for the $Tr_1$. A first insulator layer 103 was deposited thereon so that it might function as a gate insulator film and an interlayer insulator. This was followed by depositing an amorphous silicon film or a polysilicon film 104 by CVD or a like process, which was patterned using a mask 2. Then, by using the mask 1, an etching stopper 105 made of silicon nitride and the like was established in such a manner that it might be superposed on the selection line. Otherwise, the etching stopper might be patterned in a self-aligned manner by irradiating a light from the back of the substrate so that an etching stopper might be patterned out to be superposed on the selection line.

Then, a semiconductor film 106 having been doped with an impurity was formed and patterned using a mask 3. At this step, the semiconductor film 106 should be patterned into a particular shape so that it may give a gate electrode for the $Tr_2$. Then, a data line 108 was formed from a metal material using a mask 4 to thereby establish a contact with the drain of the semiconductor film 106. This was followed by the patterning of a ferroelectric film 107 using a mask 5. This ferroelectric film might be established using various types of inorganic and organic materials referred hereinbefore, but in case an organic material is selected, care should be taken in the consecutive process steps because there are limits in the processing temperatures.

A second insulator layer 109 was established thereafter, and after establishing an amorphous-silicon or a polysilicon film 110 using a mask 6, an etching stopper 111 was formed using the mask 3 in such a manner that it may be superposed on the selection lines.

Then, the impurity-doped semiconductor film 112 was deposited and patterned using a mask 7. A voltage supplying line 113 was then formed from a metal material using a mask 8 to thereby establish a contact with the drain of the semiconductor film 112. Further thereon, a transparent conductive film 114 was patterned using a mask 9.

Up to the steps above, a total of nine masks were used. The steps involving a mask totaled eleven times. The ferroelectric may be patterned using the mask 3 as it is.

To use less number of masks, two TFTs may be formed at the same time and then connecting the two using a wiring. In such a case, the process steps using a mask becomes 7 steps in total.

In the circuit according to the embodiment of the present invention, the ferroelectric capacitor was not established separately but rather as a part of the gate insulator film for $Tr_2$. However, the circuit is essentially equivalent to the one illustrated in FIG. 1.

What is to be taken notice here is that, structure in which the gate insulator film and the ferroelectric film are superposed, the thickness of the ferroelectric film should be so designed that it may sufficiently undergo spontaneous polarization upon application of a voltage. It should be well aware that the permittivity (dielectric constant) of a ferroelectric film is larger than those of a normal gate insulator material such as silicon oxide and silicon nitride.

Furthermore, spontaneous polarization is induced only upon application of an electric field of $10^4$V/cm or higher to the gate insulator material. More specifically, when a voltage of 10V were to be applied to the gate electrode, the ferroelectric film should be 10 $\mu$m or less in thickness. However, if a ferroelectric film about 0.1 $\mu$m in thickness were to be deposited and covered thereafter by a silicon oxide film of a similar thickness, most part of the voltage applied to the films would effect on the silicon oxide film having a lower permittivity (dielectric constant), because the voltage would be applied to the films in correspondence with the relative permittivity (relative dielectric constant) of the material. Thus, the ferroelectric film would not be subjected to a sufficiently high voltage which would cause the film undergo spontaneous polarization. Specifically, for example, as an inorganic ferroelectric has in general a relative permittivity (relative dielectric constant) of 1000 or higher, the voltage applied thereto results in about 0.1V.

As described in detail in the foregoing, the present invention provides a display device having a novel function never realized in the art. By making the most of the characteristic of this display device, i.e., the memory function of the display itself, the application field of an LCD was considerably extended.

More specifically, the present invention provides an LCD of a low-power consuming type for static images, which provides readily recognizable images having a high image quality. This can be applied to apparatuses especially designed for read-only displays, which do not deal with moving images. No such types of LCDs have been commercialized, and STNLCDs and the like were used for this type of apparatuses. However, the conventional LCD displays had some difficulty in providing readily recognizable images due to a low contrast and a narrow visual angle, and hence a supporting device such as a backlight was believed indispensable. This further increased the power consumption by further adding the power for the backlight to the power consumed in the driver circuit. Thus, it was unfeasible for portable apparatuses in which the LCDs should have advantage.

In contrast to the conventional LCDs, the present invention provides a static LCD which is low in power consumption by nature, and which is also advantageous in that it has an excellent view, particularly, in that it can provide sufficiently clear images without using any backlights.

The incorporation of a TFT inevitably increases the fabrication cost of the LCD according to the present invention as compared with that of a conventional LCD operating in an STN mode, however, if compared with conventional TFTLCDs, the LCD according to the present invention allows use of lower quality TFTs, and hence the fabrication cost is far reduced. By taking further into account the power consumption and the quality of the image, the disadvantage concerning the cost in comparison with an STNLCD can be completely overcome.

Particularly in a display with a large matrix, the conventional STN mode LCDs are at all useless because of the problematic occurrence of crosstalk. It is also a distinct feature of the present invention that there are no limits imposed concerning the display area.

Furthermore, the present invention enables, by carrying out data compression, display of such a high speed motion which was not possible to follow by a conventional LCD due to the overcapacity and the like. This characteristic can be fully taken advantage of if the present invention were to be applied to computer displays.

Still more, the present invention can be advantageously applied to the display of images by digital gradation. In such a case, the load on the peripheral circuits can be considerably reduced by data compression.

As described in detail in the foregoing, it can be seen that the present invention has a wide field of application in which its advantageous characteristics can be fully exhibited.

While the invention has been described in detail and with reference to specific embodiments thereof, it will be apparent to one skilled in the art that various changes and modifications can be made therein without departing from the spirit and scope thereof.

The driving method described above in FIG. 1(B) can be modified as follows. Pulses can be applied to the selection line (addressing line) $V_G$ periodically in FIG. 1(B). The pixels can be addressed at an addressing period longer than a period of alternating potential $V_2$ of the pixel electrode. In FIG. 1(B), the period of alternating potential $V_2$ is equal to a period at which a voltage applied to the voltage supplying line is alternated. The addressing can be carried out by applying one pulse to the addressing line during the addressing period.

What is claimed is:

1. An electro-optical device of an active matrix type comprising:
    a pixel comprising a first element for selecting said pixel, a memory element for storing an output of said first element where said memory element comprises a ferroelectric capacitor comprising a pair of electrodes and ferroelectric material provided between said electrodes, and a second element for feeding electric power to said pixel based on the stored output such that the second element is turned on when the stored output exceeds a predetermined voltage so that the electric power can be fed to said pixel and whereby the spontaneous polarization of the ferroelectric capacitor defines a lower limit for said stored output while said electric power is being fed to said pixel and whereby the ferroelectric capacitor, in response to storing a further output of said first element, is reversed in polarity to turn the second element off so that the electric power can not be fed to the pixel.

2. The device of claim 1 wherein said first element comprises a thin film transistor and said second element comprises a thin film transistor.

3. The device of claim 2 wherein said capacitor is connected between a gate electrode of said thin film transistor of said second element and one of source and drain of said thin film transistor of said first element.

4. The device of claim 3 wherein a gate electrode of said thin film transistor of said first element is connected with a selection signal line, the other one of said source and drain is connected with a data signal line, one of source and drain of said thin film transistor of said second element is connected with a voltage supplying line, and the other one of said source and drain of said thin film transistor of said second element is connected with a pixel electrode.

5. The device of claim 4 wherein said first element further comprises another thin film transistor and the two thin film transistors of said first element are n-channel and p-channel transistors.

6. The device of claim 5 wherein a gate electrode of said another thin film transistor is connected with said selection signal line, one of source and drain regions of said another thin film transistor is connected with said data signal line, and the other one of said source and drain regions of said another thin film transistor is connected with said capacitor.

7. The device of claim 2 wherein said thin film transistor of said first element is a polysilicon thin film transistor.

8. The device of claim 2 wherein said thin film transistor of said first element is an enhancement type thin film transistor and said thin film transistor of said second element is a depression type thin film transistor.

9. The device of claim 2 wherein said thin film transistor of said first element is NMOS and said thin film transistor of said second element is PMOS.

10. The device of claim 2 wherein said thin film transistor of said first element is PMOS and said thin film transistor of said second element is NMOS.

11. The method of driving an electro-optical device comprising the steps of:

rewriting pixels by applying a pulse to a gate electrode of a first transistor connected with one electrode of a nonvolatile capacitor at one of source and drain of said first transistor only after changing a polarity of an alternating electric potential and while applying said alternating electric potential to the other one of said source and drain, and applying a zero voltage to one of source and drain of a second transistor before the application of said pulse, the other one of said source and drain of said second transistor being connected with a pixel electrode, and a gate electrode of said second transistor being connected with the other electrode of said nonvolatile capacitor.

12. The method of claim 11 wherein said nonvolatile capacitor comprises said one electrode, the other electrode, and a ferroelectrics provided between said one electrode and the other electrode.

13. The method of claim 11 wherein said pixel is written between a zero potential and an alternating potential by applying a zero potential and a positive potential and a negative potential to said one of the source and drain of the second transistor.

14. A method of driving an electro-optical device of an active matrix type, having a plurality of pixels, each of said pixels being provided with a first switching element for selecting a corresponding pixel in response to a select signal supplied thereto, a nonvolatile memory element comprising a ferroelectric capacitor for storing an output of said first switching element, and a second switching element for switching the corresponding pixel in response to the output of said first switching element stored by said memory element such that the second switching element is turned on when the stored output exceeds a predetermined voltage so that electric power can be fed to said pixel and whereby the spontaneous polarization of the ferroelectric capacitor defines a lower limit for said stored output while said electric power is being fed to said pixel and whereby the ferroelectric capacitor, in response to storing a further output of said first switching element, is reversed in polarity to turn the second element off so that the electric power can not be fed to the pixel, said method comprising the steps of:

addressing the first switching element of one of said pixels to be rewritten with a select signal in order that said first switching element outputs either ON or OFF signal;

supplying a voltage to said one of the pixels through the corresponding second switching element continuously when the corresponding memory element stores said ON signal, and stopping supplying the voltage to said one of the pixels when the corresponding memory element stores said OFF signal.

15. The method of claim 14 wherein said first switching element is a first transistor and said second switching element is a second transistor.

16. The method of claim 15 wherein said first transistor is connected to a first electrode of said capacitor at one of its source and drain, and the second electrode of said capacitor is connected to a gate of said second transistor.

17. The method of claim 15 wherein said nonvolatile capacitor comprises a pair of electrodes and a ferroelectrics provided between said electrodes, and one of said electrodes is connected with a source of said first transistor and the other one of said electrodes is connected with a gate electrode of said second transistor.

18. The method of claim 16 wherein said electro-optical device further comprises an addressing line for supplying the select signal to a gate of the first transistor, a data line connected to the other one of the source and drain of said first transistor, and a voltage supplying line connected to one of source and drain of the second transistor for supplying a voltage to said pixel through the second transistor.

19. The method of claim 18 wherein the other one of the source and drain of the second transistor is connected to the corresponding pixel.

20. The method of claim 14 wherein said first element is not supplied with another select signal until said pixel is rewritten again.

21. A method of driving an electro-optical device of an active matrix type wherein said electro-optical device comprises an addressing line, a data line, a voltage supplying line, a first transistor, a second transistor, and a non-volatile capacitor connected between said first transistor and said second transistor, and said addressing line is connected with a gate electrode of said first transistor and said data line is connected with a drain of said first transistor and said voltage supplying line is connected with a drain of said second transistor, and wherein said nonvolatile capacitor comprises a pair of electrodes and a ferroelectrics provided between said electrodes, and one of said electrodes is connected with a source of said first transistor and the other one of said electrodes is connected with a gate electrode of said second transistor, said method comprising the step of:

addressing pixels at an addressing period longer than a period of alternating potential of a pixel electrode of said electro-optical device.

* * * * *